(12) United States Patent
Chengalva et al.

(10) Patent No.: US 7,094,975 B2
(45) Date of Patent: Aug. 22, 2006

(54) CIRCUIT BOARD WITH LOCALIZED STIFFENER FOR ENHANCED CIRCUIT COMPONENT RELIABILITY

(75) Inventors: Suresh K. Chengalva, Kokomo, IN (US); David W. Ihms, Russiaville, IN (US); Bruce A. Myers, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 213 days.

(21) Appl. No.: 10/717,839

(22) Filed: Nov. 20, 2003

(65) Prior Publication Data

US 2005/0109534 A1  May 26, 2005

(51) Int. Cl.
*H05K 1/03* (2006.01)
(52) U.S. Cl. ..................................... 174/256
(58) Field of Classification Search ............... 174/256, 174/259, 260
See application file for complete search history.

(56) References Cited

U.S. PATENT DOCUMENTS

| | | | | |
|---|---|---|---|---|
| 5,900,675 A | * | 5/1999 | Appelt et al. ............... | 257/778 |
| 5,958,556 A | * | 9/1999 | McCutcheon ............... | 428/172 |
| 6,011,697 A | | 1/2000 | Budnaitis et al. ........... | 361/792 |
| 6,014,317 A | * | 1/2000 | Sylvester .................... | 361/760 |
| 6,020,221 A | | 2/2000 | Lim et al. ................... | 438/125 |
| 6,156,980 A | | 12/2000 | Peugh et al. ................ | 174/252 |
| 6,519,843 B1 | | 2/2003 | Lauffer et al. ............... | 29/840 |

* cited by examiner

*Primary Examiner*—Kamand Cuneo
*Assistant Examiner*—Yuriy Semenenko
(74) *Attorney, Agent, or Firm*—Stefan V. Chmielewski

(57) ABSTRACT

A circuit board assembly comprising a laminate substrate and a surface mount device having a CTE less than that of the laminate substrate and attached with at least one solder joint to a first surface of the laminate substrate. The assembly further includes a localized stiffener attached to a second surface of the laminate substrate so as to be directly opposite the circuit device. The localized stiffener is formed of a material and is shaped so that, when attached to the laminate substrate, the stiffener is capable of increasing the thermal cycle fatigue life of the one or more solder joints that attach the device to the substrate.

18 Claims, 1 Drawing Sheet

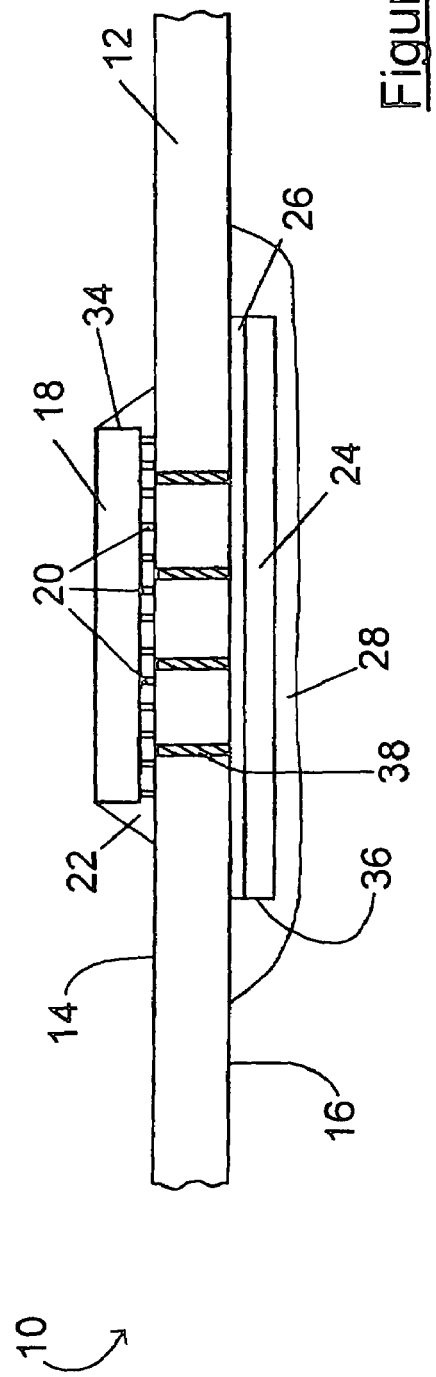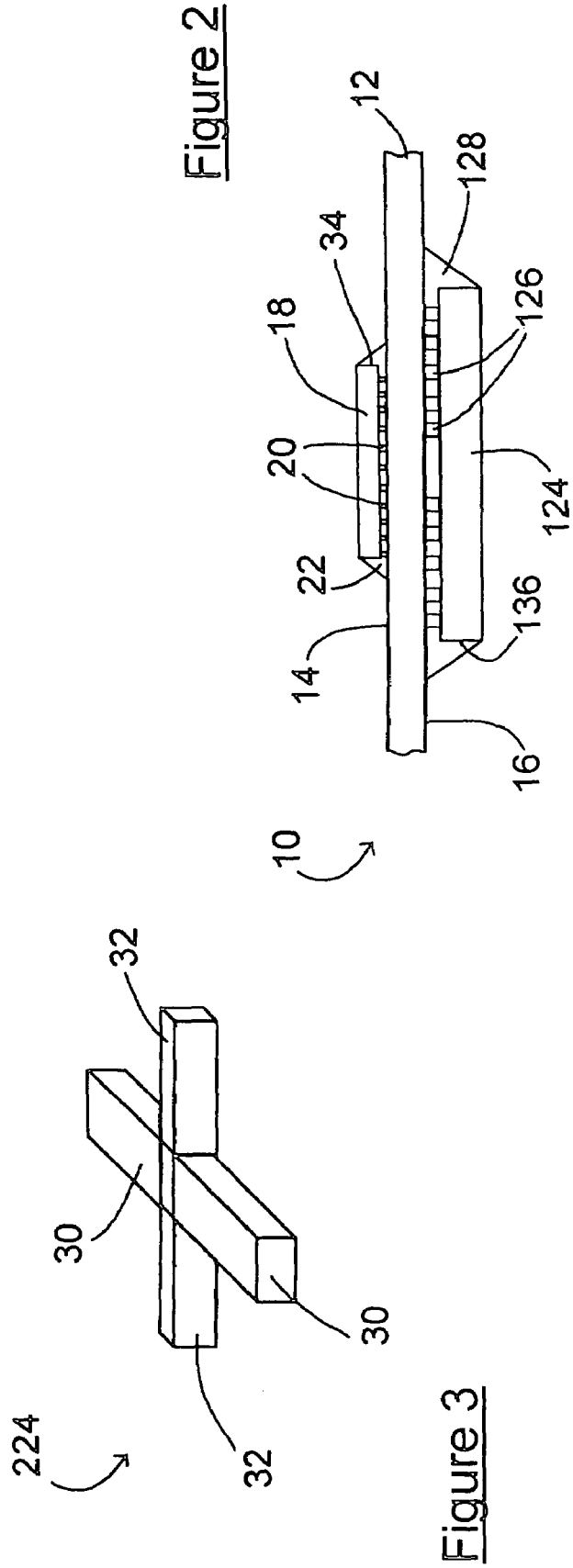

CIRCUIT BOARD WITH LOCALIZED STIFFENER FOR ENHANCED CIRCUIT COMPONENT RELIABILITY

BACKGROUND OF THE INVENTION (1) Field of the Invention

The present invention generally relates to surface-mount circuit devices. More particularly, this invention relates to a laminate circuit board substrate modified to have a localized stiffener on a surface opposite a surface-mount circuit device so as to improve the fatigue life of one or more solder joints securing the device to the substrate.

(2) Description of the Related Art

Electronic circuit assemblies are often required to be capable of surviving in hostile operating environments, including those commonly found in automotive and aerospace applications. Such assemblies often employ surface-mount (SM) integrated circuit (IC) devices, which are generally characterized as being electrically and mechanically attached to the substrate of a circuit assembly with one or more terminals or leads that are soldered to conductors on the substrate surface. A prominent example of a SM IC device is a flip chip which has bead-like terminals typically in the form of solder bumps along the perimeter of the chip. After registering a flip chip to its corresponding conductor pattern on a substrate, heating above the liquidus temperature of the solder causes the solder bumps to reflow, forming solder joints that secure the chip to the substrate and electrically interconnect the chip circuitry to the conductor pattern.

Due to the numerous functions typically performed by the microcircuitry of a flip chip, a relatively large number of solder joints are typically required, resulting in the joints being crowded along the edges of the chip. To reduce device profile and the overall size of circuit board assemblies, a current IC packaging trend is for smaller solder joints to reduce bump pitch, which also reduces device standoff height resulting in solder joints that are less compliant. Such size constraints result in solder joints of minimal size and therefore reduced strength. Complicating this is the fact that solder joints are subject to thermal stresses as a result of temperature fluctuations in the working environment of the assembly and differences in coefficients of thermal expansion (CTE) of the various materials used in the construction of the assembly. A CTE mismatch particularly exists for flip-chip-on-board (FCOB) processes in which a flip chip is mounted to an organic laminate circuit board, such as a printed wiring board (PWB) or printed circuit board (PCB). As a result of their multilayer laminate construction and compositions, such substrates typically have CTE's in the circuit plane of about 17 ppm/EC, which is significantly higher than CTE's of the materials (e.g., silicon, alumina, quartz, etc.) of which SM devices are formed, e.g., typically not higher than about 10 ppm/EC. Thermal stresses arising from this CTE mismatch can potentially fatigue and fracture the solder joints, particularly if the device is subject to many temperature excursions, high temperatures, and/or intense vibration.

To reduce and distribute stresses on their solder joints, SM devices mounted to laminate organic substrates are typically underfilled to encapsulate their solder joints. For example, epoxy resins containing a glass filler have been used as underfill materials for SM IC devices, including flip chips. The glass filler reduces the CTE of the underfill material in order to mitigate the thermal mismatch between the flip chip and circuit board. Other approaches to improving solder joint fatigue life include modifying the solder composition and increasing the solder bump (joint) height. While such approaches have the ability to improve solder joint fatigue life, further improvements would be desirable.

BRIEF SUMMARY OF THE INVENTION

The present invention is directed to a circuit board assembly comprising a laminate substrate and a surface mount device having a CTE less than that of the laminate substrate and attached with at least one solder joint to a first surface of the laminate substrate. According to the invention, the circuit board assembly includes a localized stiffener attached to a second surface of the laminate substrate so as to be directly opposite the circuit device. The localized stiffener is formed of a material and is shaped so that, when appropriately attached to the laminate substrate, is capable of increasing the thermal cycle fatigue life of the one or more solder joints that attach the device to a laminate substrate. For this purpose, the localized stiffener has at least one lateral dimension in a plane parallel to the first and second surfaces of the laminate substrate that is greater than a corresponding lateral dimension of the device. Furthermore, the CTE of the localized stiffener is less than the CTE of the laminate substrate, and the modulus of elasticity of the localized stiffener is equal to or greater than that of the laminate substrate.

According to the invention, the localized stiffener is able to increase the longevity of a surface-mount device mounted to a laminate substrate by locally inhibiting the thermal expansion and shrinkage of a region of the substrate directly beneath the device, thereby reducing the stresses on the one or more solder joints that attach the device to the substrate. Such improvements can be achieved in combination with more conventional approaches, such as device underfilling, modified solder compositions, and thinner laminate substrates. The localized stiffener can also be utilized to reduce yield losses attributable to excessive warpage and stresses that can occur during the circuit board assembly process.

Other objects and advantages of this invention will be better appreciated from the following detailed description.

BRIEF DESCRIPTION OF THE DRAWINGS

FIG. 1 is a cross-sectional view of a portion of a laminate circuit board substrate on which a flip chip is mounted to a first surface thereof, and on which a localized stiffener is attached directly opposite the flip chip in accordance with a preferred aspect of this invention.

FIG. 2 is a cross-sectional view similar to FIG. 1, but with the stiffener of FIG. 1 replaced with a second flip chip attached opposite the first chip in accordance with a second embodiment of this invention.

FIG. 3 is a perspective view of an alternative configuration for a stiffener suitable for use as the localized stiffener of FIG. 1.

DETAILED DESCRIPTION OF THE INVENTION

FIG. 1 represents a portion of a circuit board assembly 10 comprising a substrate 12 on whose surface 14 a surface mount component 18, such as a flip chip, is attached. The substrate 12 is a laminate organic substrate, such as a printed circuit board (PCB) or a printed wiring board (PWB). An example of a suitable substrate material is known as FR-4, available in various thicknesses (e.g., about 0.015 to about 0.065 inch (about 0.38 to about 1.65 mm)) and typically having a CTE of about 17 ppm/EC in the plane of the substrate. FR-4 boards are typically a glass-reinforced or woven fiberglass-reinforced epoxy resin laminate available from various sources.

As known in the art, the component 18 may be formed of a semiconductor material, such as silicon, in whose surface integrated circuits are formed. Other potential materials for the component 18 include alumina, beryllia, quartz, etc. As is conventional, the component 18 is electrically and physically connected by a number of solder joints 20 to solderable pads (not shown) defined on the surface 14 of the laminate substrate 12. The solder joints 20, which are typically formed by reflowing solder bumps, support the component 18 above the surface of the substrate 12 as shown. The solder is typically a eutectic or near-eutectic tin-lead solder, though the use of other solder compositions is also within the scope of this invention.

Because of the different materials used to form the substrate 12, component 18 and solder joints 20, a mismatch in coefficients of thermal expansion (CTE) exists. In particular, the CTE of the component 18 is much less than that of the substrate 12. This mismatch generates stresses during temperature excursions that are concentrated in the solder joints 20, which if sufficiently severe leads to fatigue fracturing of the joints 20. To mitigate the adverse effect of such stresses, an underfill material 22 is shown as covering the solder joints 20 and completely filling the void between the substrate 12 and component 18. In accordance with conventional practice, the underfill material 22 is also shown as completely surrounding the peripheral boundary 34 of the component 18.

The above-described assembly 10 is merely intended to generally represent one of various circuit assemblies to which this invention applies. Therefore, the teachings of this invention are not limited to the specific configuration shown in FIG. 1, and can be applicable to electronic assemblies that utilize essentially any type and combination of surface mount technology (SMT) packages and various terminal designs, as well as overmold circuits and components.

To further mitigate the adverse effect of the CTE mismatch between the component 18 and the laminate substrate 12, FIG. 1 shows the circuit board assembly 10 as further comprising a localized stiffener 24 on a surface 16 of the laminate substrate 12 directly opposite the component 18. The stiffener 24 is represented as being attached to the substrate 12 with a bonding material 26 that may be, for example, a polymer adhesive, solder, etc., as further discussed below, though lamination of the stiffener 24 to the substrate 12 is also within the scope of this invention. The role of the stiffener 24 is to locally stiffen that portion of the laminate substrate 12 directly beneath the component 18 so as to reduce the extent to which the local portion of the substrate 12 expands and contracts during temperature excursions, with the effect of reducing stresses on the chip solder joints 20. In particular, the stiffener 24 preferably serves to locally increase the biaxial bending stiffness of that portion of the laminate substrate 12 between the component 18 and the stiffener 24. For this purpose, the stiffener 24 is formed of a material having a CTE that is less than the CTE of the laminate substrate 12, and preferably something between the CTE's of the substrate 12 and component 18. For example, for a silicon component 18 (CTE of about 2.3 ppm/EC) attached to an FR-4 substrate (in-plane CTE of about 17 ppm/EC), a suitable CTE range for the stiffener 24 is about 0 to about 16 ppm/EC. Furthermore, in order to adequately counteract the thermal expansion and contraction of the substrate 12, the stiffener 24 preferably has a modulus of elasticity that is greater than that of the laminate substrate 12, which is typically on the order of about 18 to 31 GPa. Consequently, the stiffener 24 preferably has a modulus of elasticity of at least 18 GPa, and more preferably at least 300 GPa. To further promote the stiffening effect of the stiffener 24, the peripheral boundary 34 of the component 18 preferably lies entirely within the footprint of the peripheral boundary 36 of the stiffener 24, such that each of the transverse lateral dimensions of the component 18 (i.e., the dimensions of the component 18 in a plane parallel to the substrate surfaces 14 and 16) are less than the corresponding transverse dimensions of the stiffener 24.

Various materials are capable of providing the above-noted physical and mechanical properties desired for the stiffener 24, including silicon, alumina, silicon nitride, silicon carbide, stainless steel, molybdenum, Fe—Ni alloys (e.g., Alloy 42), tungsten, etc. If formed of a material with suitable thermal properties, e.g., a thermal conductivity of at least 10 W/mK, the stiffener 24 can also serve to dissipate heat from the component 18. As shown in FIG. 1, this potential role of the stiffener 24 can be promoted by forming conductive vias (e.g., plated through-holes) 38 within the substrate 12 to improve thermal coupling of the component 18 and stiffener 24. The bonding material 26 shown in FIG. 1 as attaching the stiffener 24 to the surface 16 of the substrate 12 can also contribute to the localized stiffness of the substrate 12 and/or promote heat transfer to the stiffener 24. For example, stiffness can be enhanced if the bonding material 26 is formed of a nonductile solder, epoxy, filled epoxy, or another structural adhesive, and thermal conduction can be enhanced if the bonding material 26 is formed of solder or a thermally-filled epoxy. Stiffness can also be promoted by encapsulating the stiffener 24 by what is known as glob top encapsulation, depicted in FIG. 1 as an adhesive compound 28 that entirely encapsulates the stiffener 24 and the bonding material 26 attaching the stiffener 24 to the substrate 12. Suitable materials for the adhesive compound 28 include epoxies, filled epoxies, or another structural adhesive.

Notably, if formed of silicon, the stiffener 24 can be a rejected chip 124, as represented in FIG. 2. With this approach, a chip 124 that would otherwise be scrapped can be put to advantageous use. The stiffener chip 124 is shown as being attached to the surface 16 of the substrate 12 with multiple solder joints 126, similar to the solder joints 20 that attach the flip component 18 to the substrate 12 though without the requirement for electrically connecting the chip 124 to the substrate 12, i.e., the chip 124 is not electrically functional. As with the component 18, the solder joints 126 attaching the stiffener chip 124 to the substrate 12 space the chip 124 from the substrate surface 16 to define a gap, and this gap is preferably filled with an underfill material 128 that completely fills the gap to reduce stresses on the solder joints 126, as well as completely surrounds the peripheral boundary 136 of the chip 124.

The stiffeners 24 and 124 represented in FIGS. 1 and 2 generally have rectangular shapes in a plane parallel to the surfaces 14 and 16 of the laminate substrate 12. In addition, the stiffeners 24 and 124 are sized so that the peripheral boundary 34 of the component 18 is superimposed entirely within the footprint of the peripheral boundary 36 of the stiffeners 24 and 124, as discussed previously. FIG. 3 represents one of multiple other configurations that are possible for stiffeners within the scope of this invention. In each case, it is preferred that each transverse lateral dimension of the stiffener is greater than the corresponding transverse dimension of the component 18. In FIG. 3, a stiffener 224 is depicted as having a cross-shape configuration defined by two pairs of opposing legs 30 and 32 that establish the lateral dimensions of the stiffener 224. The stiffener 224 may be attached to the substrate 12 so that each pair of opposing legs 30 and 32 is parallel to one of the lateral dimensions of the component 18, in which case the lateral dimension established by each pair of legs 30 and 32 is preferably greater than the lateral dimension of the component 18 with which the pair of legs 30 and 32 is parallel. Alternatively, the cross-shaped stiffener 224 can be oriented on the substrate surface 16 so that each pair of legs 30 and 32 is transverse to one of the lateral dimensions of the component 18, i.e., the legs 30 and 32 extend from corner to corner of the component 18. In this orientation, the legs 30 and 32 again preferably project beyond the lateral dimensions of the component 18.

In view of the increased stiffness of the substrate 12 beneath the component 18 resulting from the presence of stiffeners within the scope of this invention, various design possibilities are available for the laminate substrate 12 and the circuit board assembly 10 generally. For example, in applications where thicker substrates (e.g., at least 0.031 inch (about 0.79 mm) have been required to provide adequate stiffness for surface-mount devices, stiffeners of this invention can permit the use of relatively thin substrates, e.g., less than 0.031 inch (0.79 mm) whose flexibility is compatible with other design considerations including heat removal with flip chip pedestals. Processing issues such as yield losses due to excessive warpage and stresses during board assembly can also be mitigated by appropriately locating stiffeners of this invention on laminate substrates. As such, in addition to improving the reliability of surface-mount devices the stiffeners of this invention can serve to provide various processing and reliability-related requirements of circuit board assemblies utilizing laminate substrates.

While the invention has been described in terms of a preferred embodiment, it is apparent that other forms could be adopted by one skilled in the art. Accordingly, the scope of the invention is to be limited only by the following claims.

The invention claimed is:

1. A circuit board assembly comprising a laminate organic substrate having oppositely-disposed first and second surfaces, a surface-mount device attached with a plurality of solder bumps to the first surface of the laminate organic substrate, and a localized stiffener attached with a plurality of solder bumps to the second surface of the laminate organic substrate directly opposite the device wherein the solder bumps space the localized stiffener from the laminate organic substrate to define a gap therebetween, the device and the localized stiffener having lateral dimensions in a plane parallel to the first and second surfaces of the laminate organic substrate with at least one of the lateral dimensions of the localized stiffener being greater than the lateral dimensions of the device, the laminate organic substrate, the device, and the localized stiffener having coefficients of thermal expansion and having moduli of elasticity, the coefficients of thermal expansion of the device and the localized stiffener being less than the coefficient of thermal expansion of the laminate organic substrate, the modulus of elasticity of the localized stiffener being greater than the modulus of elasticity of the laminate organic substrate, the localized stiffener being attached to the laminate organic substrate so as to locally stiffen the laminate organic substrate beneath the device and thereby increase the fatigue life of the at least one solder bump.

2. A circuit board assembly according to claim 1, further comprising an underfill material that completely fills the gap between the localized stiffener and the laminate organic substrate.

3. A circuit board assembly according to claim 2, wherein the localized stiffener is a rejected surface-mount integrated circuit chip that is not electrically functional on the circuit board assembly.

4. A circuit board assembly according to claim 1, wherein the localized stiffener is entirely encapsulated with an adhesive.

5. A circuit board assembly according to claim 1, wherein the localized stiffener is larger than the device.

6. A circuit board assembly according to claim 5, wherein each of the lateral dimensions of the localized stiffener is greater than the lateral dimensions of the device.

7. A circuit board assembly according to claim 1, wherein the localized stiffener has a cross-shape in a plane parallel to the first and second surfaces of the laminate organic substrate.

8. A circuit board assembly according to claim 7, wherein the cross-shape of the localized stiffener is defined by two pairs of opposing legs that establish the lateral dimensions of the localized stiffener, each pair of the opposing legs being parallel to one of the lateral dimensions of the device, the lateral dimension established by each pair of the opposing legs being greater than the lateral dimension of the device with which the pair of opposing legs is parallel.

9. A circuit board assembly according to claim 7, wherein the cross-shape of the localized stiffener is defined by two pairs of opposing legs that establish the lateral dimensions of the localized stiffener, each pair of the opposing legs being transverse to the lateral dimensions of the device and projecting beyond the lateral dimensions of the device.

10. A circuit board assembly according to claim 1, wherein the device and the localized stiffener having peripheral boundaries that establish the lateral dimensions of the device and the localized stiffener, the peripheral boundaries of the device being superimposed entirely within the peripheral boundaries of the localized stiffener.

11. A circuit board assembly according to claim 1, wherein the solder bumps that attach the device to the first surface of the laminate organic substrate space the device from the laminate organic substrate to define a gap, the circuit board assembly further comprising an underfill material that completely fills the gap between the device and the laminate organic substrate.

12. A circuit board assembly according to claim 1, wherein the localized stiffener has a modulus of elasticity of at least about ten times greater than the modulus of elasticity of the laminate organic substrate.

13. A circuit board assembly according to claim 1, wherein the localized stiffener is formed of a material chosen from the group consisting of silicon, alumina, silicon nitride, silicon carbide, stainless steel, molybdenum, Fe-Ni alloys, and tungsten.

14. A circuit board assembly according to claim 1, wherein the circuit board assembly is an overmold circuit board assembly.

15. A circuit board assembly comprising a laminate organic substrate having oddositely-disposed first and second surfaces, a surface-mount device attached with at least one solder joint to the first surface of the laminate organic substrate, and a localized stiffener attached to the second surface of the laminate organic substrate directly Opposite the device, the device and the localized stiffener having lateral dimensions in a plane parallel to the first and second surfaces of the laminate organic substrate with at least one of the lateral dimensions of the localized stiffener being greater than the lateral dimensions of the device, the laminate organic substrate, the device, and the localized stiffener having coefficients of thermal expansion and having moduli of elasticity, the coefficients of thermal expansion of the device and the localized stiffener being less than the coefficient of thermal expansion of the laminate organic substrate, the modulus of elasticity of the localized stiffener being greater than the modulus of elasticity of the laminate organic substrate, the localized stiffener being attached to the laminate organic substrate so as to locally stiffen the laminate organic substrate beneath the device and thereby increase the fatigue life of the at least one solder joint, wherein the laminate organic substrate has conductive vias between the first and second surfaces that thermally couple the device to the localized stiffener.

16. A circuit board assembly comprising a laminate organic substrate having oppositely-disposed first and second surfaces, a surface-mount integrated circuit device attached with multiple solder bumps to the first surface of the laminate organic substrate, and a non-electrically functional stiffener attached with a plurality of solder bumps to a limited region of the second surface of the laminate organic substrate directly opposite the device wherein the plurality of solder bumps space the stiffener from the laminate organic substrate to define a gap therebetween that is completely filled with an underfill material, each of the device and the stiffener having peripheral boundaries that establish a pair of transverse dimensions in a plane parallel to the first and second surfaces of the laminate organic substrate, each of the transverse dimensions of the stiffener being greater than a corresponding one of the transverse dimensions of the device, the laminate organic substrate, the device, and the stiffener having coefficients of thermal expansion and having moduli of elasticity, the coefficients of thermal expansion of the device and the stiffener being less than the coefficient of thermal expansion of the laminate organic substrate, the modulus of elasticity of the stiffener being at least about ten times greater than the modulus of elasticity of the laminate organic substrate, the stiffener being attached to the laminate organic substrate so as to locally increase the biaxial bending stiffness of the laminate organic substrate between the device and the stiffener and thereby increase the fatigue life of the solder bumps, the laminate organic substrate having conductive vias between the first and second surfaces that thermally couple the device to the stiffener.

17. A circuit board assembly according to claim 16, wherein the stiffener is entirely encapsulated with an adhesive.

18. A circuit board assembly according to claim 17, wherein the stiffener is a rejected surface-mount integrated circuit chip.

* * * * *